(12) United States Patent
Rothman

(10) Patent No.: US 10,546,886 B2
(45) Date of Patent: Jan. 28, 2020

(54) PHOTODETECTION DEVICE WITH OVERDOPED INTERDIODE NETWORK AND MANUFACTURING METHOD

(71) Applicant: COMMISSARIAT A L'ENERGIE ATOMIQUE ET AUX ENERGIES ALTERNATIVES, Paris (FR)

(72) Inventor: Johan Rothman, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/491,538

(22) Filed: Apr. 19, 2017

(65) Prior Publication Data
US 2017/0309663 A1    Oct. 26, 2017

(30) Foreign Application Priority Data

Apr. 26, 2016 (FR) ..................................... 16 53666

(51) Int. Cl.
*H01L 25/16* (2006.01)
*H01L 27/146* (2006.01)
*H01L 31/0296* (2006.01)

(52) U.S. Cl.
CPC .. *H01L 27/14607* (2013.01); *H01L 27/14636* (2013.01); *H01L 27/14696* (2013.01); *H01L 31/02966* (2013.01)

(58) Field of Classification Search
CPC .......... H01L 27/14607; H01L 31/1032; H01L 27/1446; H01L 31/02966; H01L 27/14636;
(Continued)

(56) References Cited

U.S. PATENT DOCUMENTS

| 7,936,034 B2 | 5/2011 | Rothman |
| 8,232,560 B2 | 7/2012 | Robin et al. |
| 8,975,718 B2 | 3/2015 | Rothman |

(Continued)

FOREIGN PATENT DOCUMENTS

| EP | 0 350 351 A1 | 1/1990 |
| EP | 2 806 457 A2 | 11/2014 |

(Continued)

OTHER PUBLICATIONS

French Preliminary Search Report dated Dec. 23, 2016 in French Application 16 53666 filed on Apr. 26, 2016 (with English Translation of Categories of Cited Documents).

(Continued)

*Primary Examiner* — Moin M Rahman
(74) *Attorney, Agent, or Firm* — Oblon, McClelland, Maier & Neustadt, L.L.P.

(57) ABSTRACT

The invention relates to a photodetection device comprising a substrate and a diodes network, the substrate comprising an absorption layer and each diode comprising a collection region with a first type of doping in the absorption layer. The device comprises a conduction mesh under the surface of the substrate, comprising at least one conduction channel inserted between the collection regions of two adjacent diodes, the at least one conduction channel having a second doping type opposite the first type and a higher doping density than the absorption layer. The doping density of the at least one conduction channel is derived from metal diffusion in the absorption layer from a metal mesh present on the substrate surface. The absorption layer has the first doping type. The invention also relates to a method of making such a device.

18 Claims, 5 Drawing Sheets

(58) Field of Classification Search
CPC ............ H01L 27/14696; H01L 25/167; H01L 27/14643; H01L 27/3227; H01L 31/02024; H01L 31/0203; H01L 31/0284; H01L 31/107
See application file for complete search history.

(56) References Cited

U.S. PATENT DOCUMENTS

| | | | |
|---|---|---|---|
| 9,013,019 | B2 | 4/2015 | Rothman |
| 9,178,101 | B2 | 11/2015 | Mollard et al. |
| 9,236,415 | B2 | 1/2016 | Mollard et al. |
| 9,269,739 | B2 | 2/2016 | Mollard et al. |
| 9,406,831 | B2 | 8/2016 | Rothman |
| 2002/0185702 | A1* | 12/2002 | Shirai ................ G02B 6/4249 257/443 |
| 2005/0194654 | A1* | 9/2005 | Iguchi ................ H01L 27/1446 257/458 |
| 2013/0264543 | A1* | 10/2013 | Espiau De Lamaestre ................ H01L 31/0232 257/21 |

FOREIGN PATENT DOCUMENTS

FR   2 983 347 A1   5/2013
JP   62-119976     6/1987

OTHER PUBLICATIONS

U.S. Appl. No. 11/579,508, filed Nov. 3, 2006, 2008/0031300 A1, Johan Rothman et al.
U.S. Appl. No. 14/402,020, filed Nov. 18, 2014, 2015/0303320 A1, Francois Boulard et al.
U.S. Appl. No. 14/919,130, filed Oct. 21, 2015, 2016/0111580 A1, Olivier Gravrand et al.

* cited by examiner

PHOTODETECTION DEVICE WITH OVERDOPED INTERDIODE NETWORK AND MANUFACTURING METHOD

TECHNICAL DOMAIN

The domain of the invention is photo-detectors comprising a diodes network, such as a matrix network, manufactured on a semiconducting substrate. The invention relates more precisely to p/n or n/p diodes that can be used for imagers in the visible or in the infrared.

STATE OF PRIOR ART

Diodes are arranged in diode matrices on a substrate, in many photo-detection applications. In a matrix, diodes are arranged in rows and in columns. A matrix of diodes can be used to enable detection of electromagnetic radiation. Electron-hole pairs can be formed by interaction between the electromagnetic radiation and the substrate. This enables the development of a current proportional to an intensity of incident radiation. Each diode then forms one pixel of a photo-detector.

By coupling the diodes matrix with an electronic read circuit, it is thus possible to capture the variation in space and time of the light intensity on the photo-detector. The sensitivity of this type of photo-detector is given by its ability to translate small variations of the light intensity in space or in time into a usable signal, despite random variations (noise) resulting from thermal and electrical phenomena in diodes and in the read circuit.

Such a matrix of diodes is illustrated on FIGS. 1a and 1b that represent a top view and a sectional view respectively, on the section plane reference 1b on FIG. 1a, along a row of the matrix. A diode is formed in a substrate with an absorption layer 1 made of a semiconducting material with a prohibited band gap and characterised by a type of conductivity. The diode comprises a collection region 2 with the opposite type of conductivity, thus forming a p-n junction.

As illustrated on FIG. 1b, each collection region is in contact with a metallic pad 3 forming a diode contact. A metallic region 4, formed around the periphery of the matrix, is in contact with the substrate and forms a substrate contact. The two regions with opposite types of conductivity 1, 2 are protected from degradation of their chemical, mechanical and electronic properties by means of a passivation layer 5 covering the surface of the substrate, except for diode contact and substrate contact zones.

A so-called space charge zone (ZCE) is formed in the region close to the interface between two regions with opposite types of conductivity 1, 2. This zone is characterised by the presence of an energy barrier for majority carriers on each side of the junction. Photons arriving in the absorption layer 1 of the semiconducting substrate can transfer their energy to an electron. If the electron transits between the valency band and the conduction band and moves as far as the space charge zone, the charge will be collected by the collection region 2. The charges thus collected can be transferred to an electronic circuit called a read circuit, connected to each diode to obtain a usable signal. Extraction of charge is compensated by a call for charge by the substrate contact that, in the typical case in the state of the art, is common for all diodes.

When a large photon flux is detected, each diode outputs a strong charge flux, i.e. an electrical current, proportional to the photon flux arriving close to the diode. Currents in all diodes are added through the substrate to the substrate contact. In the presence of an electrical resistance in the substrate, the current in it can have a strong influence on operation of the diodes.

This electrical resistance can thus induce a variation in the polarisation that alters operation of the diodes. In the extreme case, it can cancel the transfer of charges between diodes and the read circuit by suppressing the potential barrier in junctions. This phenomenon is particularly important when there is a large number of diodes and a large photon flux on the matrix.

This electrical resistance can strongly retard the transfer of charges in the read circuit, even in the presence of a weak flux, due to a collective RC effect.

Moreover, control over the state of the interface between the passivation layer 5 and semiconducting regions 1, 2 is crucial to maximise sensitivity. This is due to defects that may be present at the interface, but also due to states in the passivation that act as traps for charges. Defects at the interface can also act as centres for generation/recombination of carriers that reduce the photonic signal and increase the contribution of the thermal or electrical current generated in the substrate and/or in the junction. States trapped in the passivation are likely to vary the local charge density close to each trap in time. These fluctuations can in turn generate fluctuations on the photonic current and on the different darkness currents.

Therefore, in general it is required to reduce the collective series resistance effect and to stabilise the performance of diodes in order to increase the sensitivity of the photodetector.

Thus, patent application EP 2 806 457 A2 discloses a solution consisting of making an overdoping network between diodes to stabilise the interface between the substrate and the passivation layer. This solution is represented on FIG. 2. It consists of forming buried conducting lines 6 that extend between the columns and between the rows of diodes in the matrix. More precisely, these buried lines 6 are lines doped by ion implantation with the same type of doping as the absorption layer 1, and a higher doping density.

PRESENTATION OF THE INVENTION

The purpose of the invention is to improve the sensitivity of diode network photodetectors. To achieve this, it discloses a photo-detection device comprising a substrate and a diodes network. The substrate comprises an absorption layer and each diode comprises a collection region with a first doping type in the absorption layer. The device also comprises a conduction mesh under a surface of the substrate, that comprises at least one conduction channel inserted between the collection regions of two adjacent diodes, the at least one conduction channel having a second doping type opposite the first doping type and a greater doping density than the absorption layer. The absorption layer has the first doping type.

Some preferred but non-limitative aspects of this device are as follows:
- the conduction mesh is covered by a metal mesh present on the surface of the substrate;
- the doping density of the at least one conduction channel is derived from metal diffusion in the absorption layer from the metal mesh;
- it comprises a peripheral substrate contact on at least one side of the diodes network;
- the metal mesh is in electrical contact with the peripheral substrate contact;

the conduction mesh has a plurality of conduction channels arranged such that a there is a conduction channel inserted between the collection regions of all adjacent diodes in the diodes network;

a passivation layer covers the substrate except at contact regions of an electrically conducting pad with a collection region of a diode;

the absorption layer is a CdHgTe layer;

the doping density of the absorption layer is less than $10^{15}$ at/cm$^3$;

the absorption layer includes a gradual or sudden reduction in the gap, within the thickness of the absorption layer from the surface of the substrate that delimits a large gap region near the surface in which the conduction mesh and collection regions are located.

The invention also relates to a method of making a photodetection device comprising a substrate and a diodes network, the substrate comprising an absorption layer and each diode comprising a collection region in the absorption layer with a first type of doping. The method includes a step in which a conduction mesh is formed under the surface of the substrate that comprises at least one conduction channel inserted between the collection regions of two adjacent diodes, the at least one conduction channel having a second doping type opposite the first doping type and a higher doping density than the absorption layer. The method also comprises doping of the absorption layer according to the first type of doping.

BRIEF DESCRIPTION OF THE DRAWINGS

Other aspects, purposes, advantages and characteristics of the invention will be better understood after reading the detailed description given below of preferred embodiments of it, given as non-limitative examples, with reference to the appended drawings in which.

DETAILED PRESENTATION OF PARTICULAR EMBODIMENTS

Figure 1A:
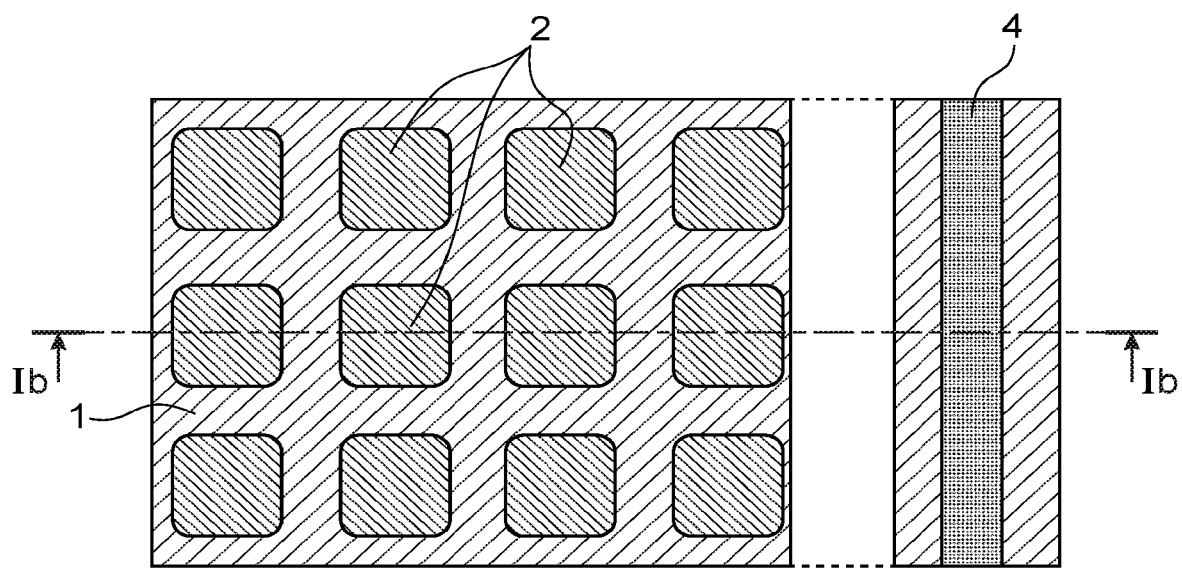
FIGS. 1a and 1b show a top view and a section view of a matrix of diodes, respectively.
Figure 3A:
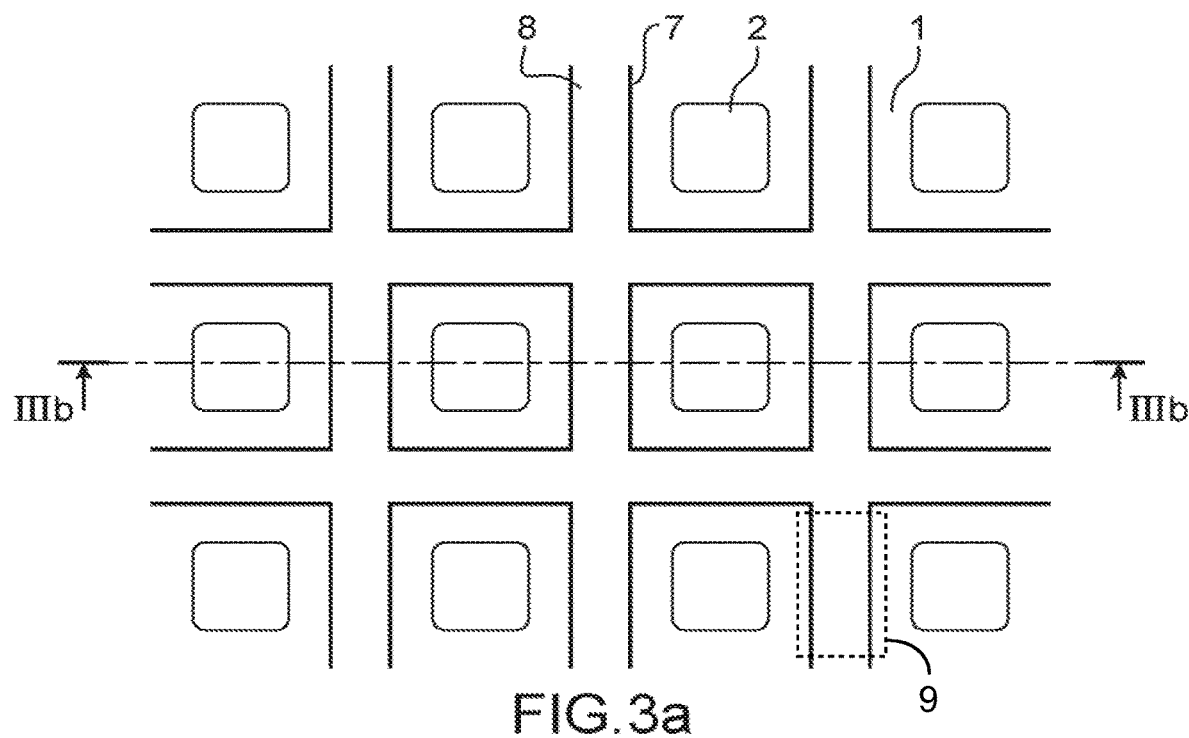
FIGS. 3a and 3b show a top view and a longitudinal sectional view respectively of a row of diodes in a matrix of diodes conforming with the invention.
Figure 3B:
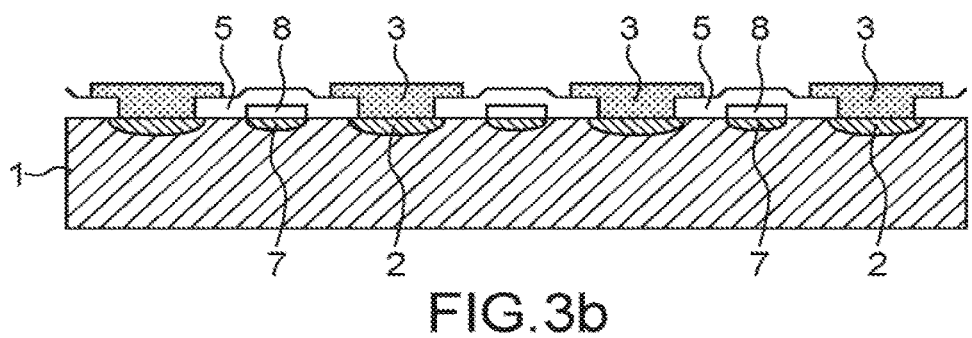

With reference to FIGS. 3a and 3b, the invention relates to a photo-detection device comprising a substrate and a network of diodes. These FIGS. 3a and 3b represent a top view and a sectional view respectively, on the section plane reference IIIb on FIG. 1a, along a row of the network.

The substrate comprises an absorption layer 1 with a first type of doping and each diode comprises a collection region that also has the first doping type, in the absorption layer 1.

The absorption layer may for example be a CdHgTe layer. Such a layer may in particular be formed by epitaxy on a CdZnTe substrate. Its composition in cadmium may be between 20 and 40%. Its thickness is preferably less than 5 μm, for example 3 μm.

The doping of the absorption layer 1 may be of then type. It may be an extrinsic doping, for example by incorporation of indium. The doping density of the absorption layer is typically less than $10^{15}$ at/cm$^3$.

Doping of the collection layer 2 is also of the n type. This doping may be extrinsic, for example by incorporation of indium. The doping density of the collection region 2 is higher than the doping density of the absorption layer. It is typically between $10^{16}$ and $10^{18}$ at/cm$^3$.

Obviously, the invention extends to the case of p type doping of the absorption layer 1 and of the collection region 2.

The device according to the invention also comprises a conduction mesh 7 under the surface of the substrate on which collection regions are made (face of the substrate opposite the face that receives the electromagnetic radiation), the conduction mesh 7 comprising at least one conduction channel 9 inserted between the collection regions of two adjacent diodes. The at least one conduction channel 9 has a second type of doping opposite the first type of doping and a higher doping density than the absorption layer. The doping density of the at least one conduction channel is typically between $10^{16}$ and $10^{18}$ at/cm$^3$.

A conduction channel 9 between the collection regions of two adjacent diodes is preferably wider (along a row of the network) than the diameter of the collection regions 2. The conduction channel typically has a width corresponding to half a pixel pitch (for example 7.5 μm for a 15 μm pitch). The collection regions have a diameter of the order of 1 to 2 μm.

The thickness of the absorption layer 1 is preferably less than the distance separating a collection region 2 from an adjacent conduction channel 9. It is typically less than 3 μm.

The combination of this thickness of the absorption layer with a sufficiently low level of doping of the absorption layer, typically less than $10^{15}$ cm$^{-3}$, has the result that the absorption layer is completely depleted in the depth below the conduction channel 9 and partially depleted in the environment of the collection region 2 during application of an inverse polarisation on the diode formed by a collection region 2 and the conduction mesh 7. The polarisation voltage is related to the thicknesses and dopings. It may typically be 1V, preferably 2V, and possibly 3V.

This structure has the advantage that it will not be the location of Auger generation in the depleted region. On the other hand, the darkness current generation current on defects Shockley-Read-Hall generation) will increase. This structure also has the advantage that it enables the collection of charges by the electrical field in the depleted region, which limits spreading of the response between pixels for a localised light excitation.

The conduction mesh is buried in the substrate and is flush with the surface of the substrate. Different conduction mesh topologies can be used within the framework of this invention. Preferably, this conduction mesh has at least one conduction channel that extends between two adjacent lines of diodes. In other words, this channel extends between two adjacent rows or two adjacent columns of diodes.

The conduction mesh preferably has a plurality of conduction channels, each of which extends between two adjacent lines (rows or columns) of diodes. In particular, a plurality of conduction channels can be arranged such that a there is a conduction channel inserted between the collection regions of each adjacent diodes in the diodes network; In other words, and as shown on FIG. 3a in the case of a matrix network of diodes, each diode is separated from its adjacent diodes by four intersecting conduction channels.

The doping density of at least one conduction channel 9 can be derived from an implantation of impurities, for example implantation or arsenic, or it can be derived from metal diffusion in the absorption layer. For example the metal is gold or copper when a P+ type doping of the conduction mesh 7 is required. For example the metal is indium when an N+ type doping of the conduction mesh 7 is required.

Diffused metal is placed on a substitution site in the crystalline network of the semiconductor by creating or acceptor states leading to overdoping. Metal diffusion is preferably done by heat treatment.

In addition to stabilising the interface between the semiconductor and the passivation layer in the same way as in patent application EP2806457A2, formation of the conduction mesh strongly doped by metal diffusion can reduce the formation of defects that occur in the case of a region strongly doped by ion implantation like that disclosed in patent application EP2806457A2. This reduction in the number of defects leads to an improvement in the performance of diodes with a reduction in the darkness current and the number of diodes affected by noise.

Metal diffusion takes place from a metal mesh 8 directly present on the surface of the substrate, for example a gold, copper or indium mesh. Therefore this metal mesh 8 directly and entirely covers the conduction mesh 7. It is thus distributed on the surface of the substrate with the same pattern as the overdoped conduction mesh.

The metal mesh 8 forms a resistive contact with the substrate in which the current is directly conducted. Thus, the presence of this metal mesh advantageously leads to a strong reduction in the series access resistance and therefore collective depolarisation and RC effects.

When the conduction mesh is made by the implantation of impurities, it may be covered by a metal mesh with the same pattern or it may be covered by a metal mesh only around its periphery.

Figure 1B:
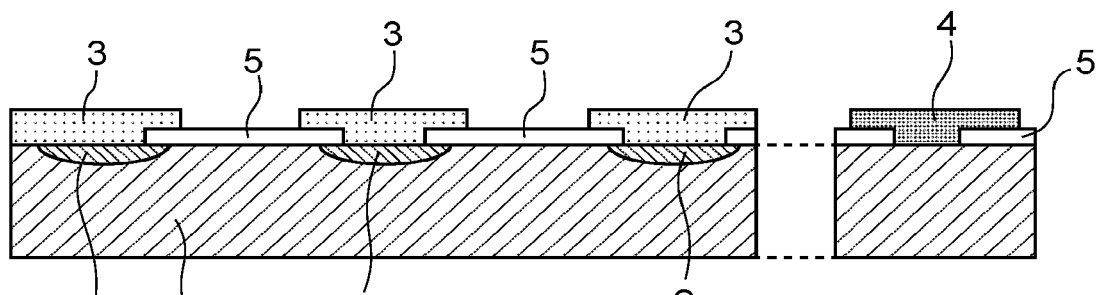
Figure 2:
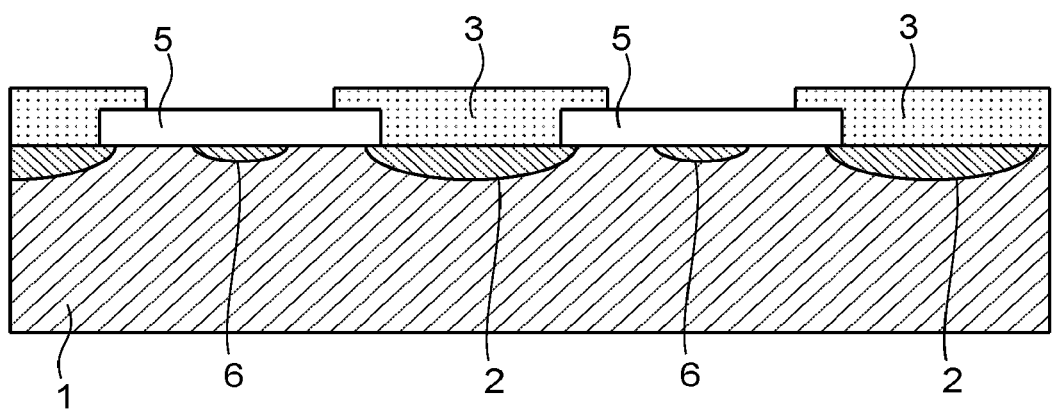
FIG. 2 shows buried conducting lines that extend between the columns and between the rows of diodes in the matrix.

The device according to the invention also comprises a peripheral substrate contact on at least one side of the diodes network. This contact is not shown on FIGS. 3a and 3b but it is similar to that discussed previously with reference to FIGS. 1a and 1b. Such a peripheral substrate contact makes an electrical connection possible between the substrate and the read circuit on the periphery of the diodes network thus releasing space between the diodes, and advantageously making it possible to make a diodes network with a small pitch between the diodes.

The conduction mesh 7 is preferably in electrical contact with the peripheral substrate contact, particularly through the metallic mesh 8.

The device according to the invention also comprises a passivation layer 5 that covers the substrate except in regions in which an electrically conducting pad 3 comes into contact with a collection region 2 of a diode, and if applicable a region in which an electrically conducting pad is in peripheral contact with the substrate.

Figure 4:
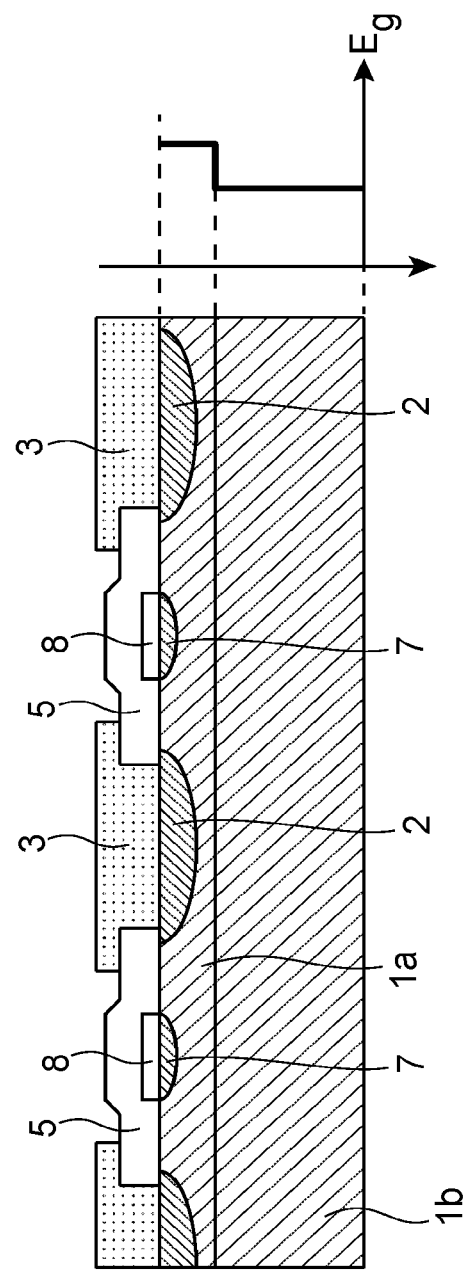
FIG. 4 illustrates a variant embodiment of the invention with a gap variation within the thickness of the absorption layer.

In one variant embodiment shown on FIG. 4, the absorption layer has a gap reduction Eg (prohibited band energy) from the surface of the substrate in the thickness of the absorption layer, this reduction taking place globally at the interface in which the collection regions and the conduction mesh are located. For example with a CdHgTe absorption layer, this gap variation may be obtained by varying the cadmium content. This gap variation makes it possible to passivate the surface (face of the substrate opposite the face that receives electromagnetic radiation), reduces generation of the tunnel darkness current induced by the concentration of the electrical field at the metal mesh, and the Auger generation induced by strong doping in collection regions 2 and the conduction mesh 7.

As shown on FIG. 4, the gap variation is sudden and takes place at a given depth in the thickness of the absorption layer from the surface of the substrate. The absorption layer is then composed of two regions 1a, 1b with different energy gap values. The high gap region 1a includes the collection regions 2 and the conduction mesh 7. The thickness of region 1a is thus between 0.5 μm and 1 μm. The region 1b subjacent to the high gap region 1a is characterised by a smaller gap. As a variant, this gap variation may be gradual.

The invention is not limited to the photodetection device described above, it also includes a method of making a photodetection device comprising a substrate and a diodes network, the substrate comprising an absorption layer 1 and each diode comprising a collection region 2 with a first type of doping in the absorption layer 1. The method includes a step in which a conduction mesh 7 is formed under the surface of the substrate, comprising at least one conduction channel inserted between the collection regions of two adjacent diodes, the at least one conduction channel having a second doping type opposite the first type and a higher doping density than the absorption layer The absorption layer according to the invention has the first doping type. A metal mesh can also be formed on the surface of the substrate, the step to form the conduction mesh then being done by metal diffusion from the metal mesh on the surface of the substrate.

Figure 5A:
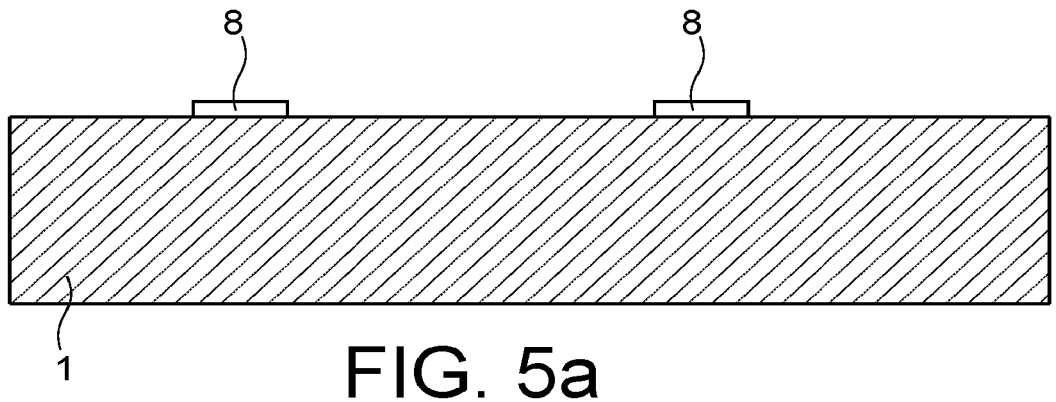
FIGS. 5a-5f illustrate one possible embodiment of a method of manufacturing a photo-detection device according to the invention.
Figure 5B:
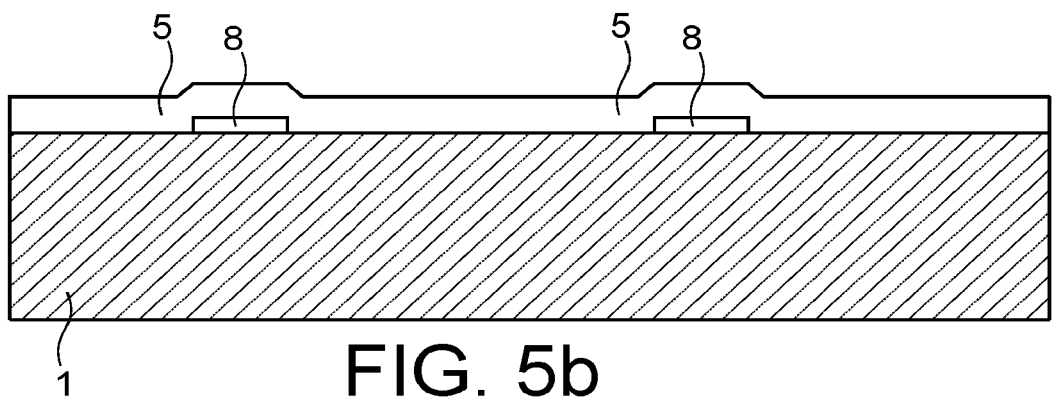
Figure 5C:
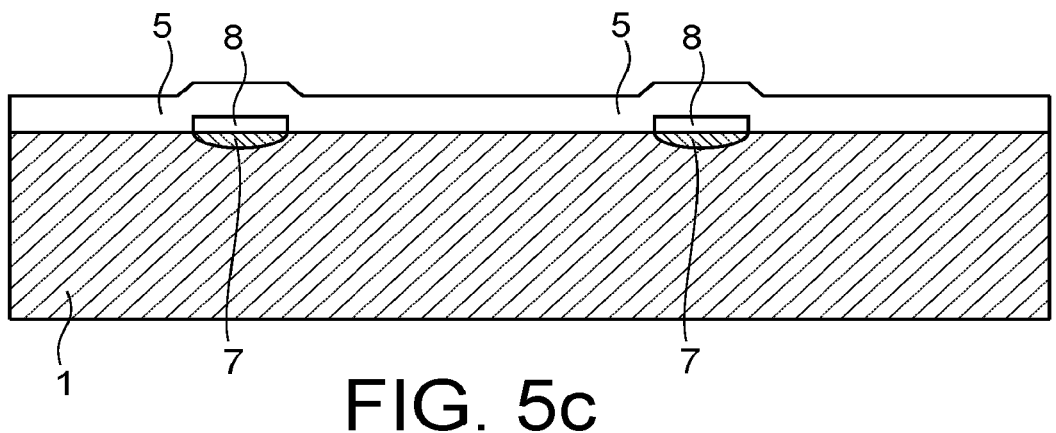

FIGS. 5a-5f illustrate an example embodiment of such a method beginning with a step in which a substrate carrying the absorption layer 1 is supplied. After a substrate surface preparation, the metal mesh 8 is deposited on the surface of the substrate as shown on FIG. 5a. For example, the metal mesh comprises several rows with a width of 1 μm and a thickness of 500 nm. FIG. 5b illustrates the deposit of a passivation layer 5 on the substrate and the metal mesh. The next step is a stabilisation annealing of the interface between the substrate and the passivation layer. This annealing enables diffusion of metal from the metal mesh towards the substrate, and as shown in FIG. 5c, resulting in the formation of the conduction mesh 7 in the substrate directly underneath the metal mesh 8 on the surface of the substrate. A simple vacuum annealing can be used when the passivation layer is deposited before metal diffusion. However, the passivation layer can be deposited afterwards, and annealing can then be done under the saturating vapour pressure of Hg.

Figure 5D:
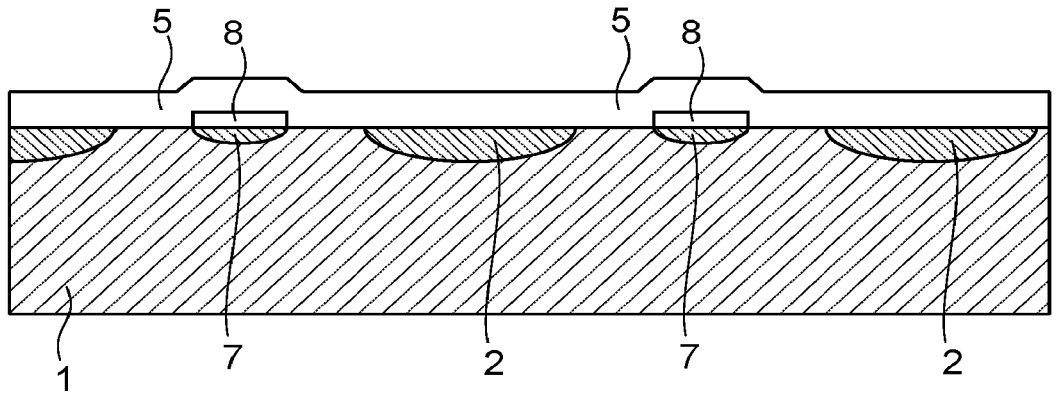

Collection regions 2 are then formed by means of an ion implantation through an appropriate mask, as shown in FIG. 5d. The diameter of each collection region may for example be between 5 and 20 μm, and these regions are spaced by a single pixel pitch, for example between 5 and 30 μm.

Figure 5E:
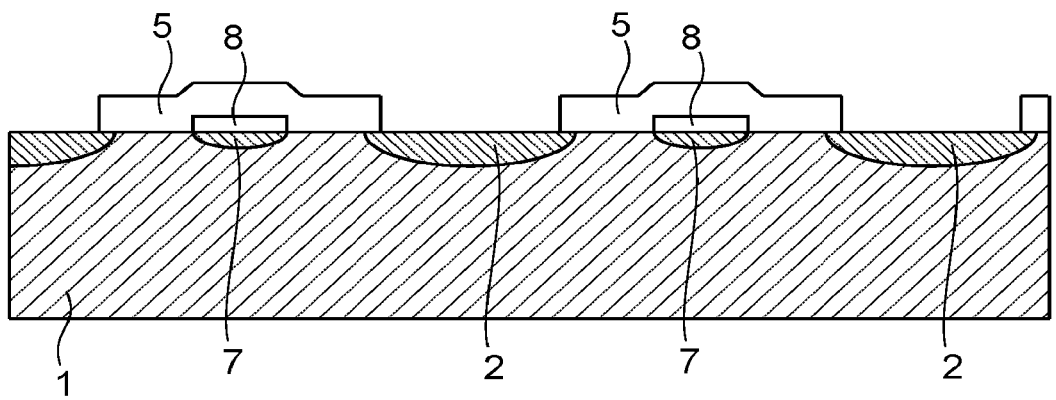

The next step as shown on FIG. 5e is to open the passivation layer 5 at each pixel, and at the periphery of the network for subsequent formation of the substrate contact.

Figure 5F:
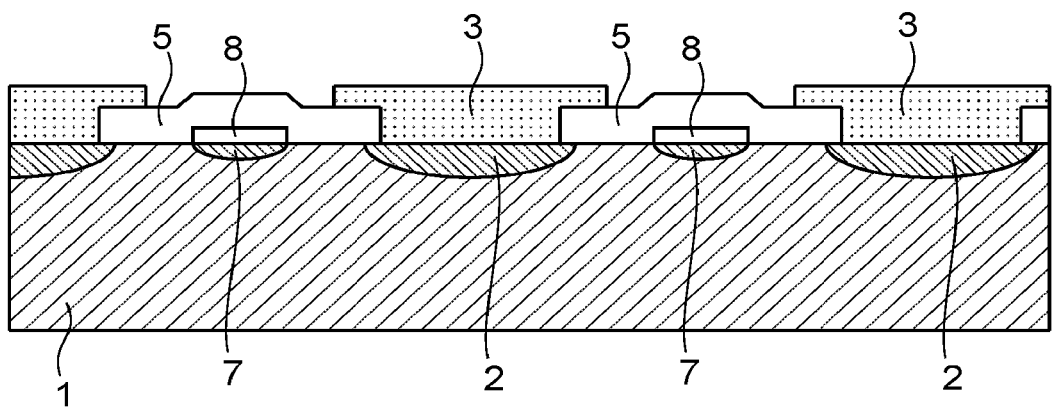

A metal layer is then deposited as shown in FIG. 5f and it is etched at each pixel and at the periphery to form diode contacts 3 and the substrate contact. The thickness of these contacts is typically less than 1 μm.

Applications of the invention advantageously include infrared imagery, particularly for imagery at high working temperatures, for which it can reduce the darkness current induced by the Auger suppression, for imagery at very low pitch for which it can stabilise the interface between diodes and increase the photodetector modulation transfer function, for large format imagery for which it can reduce the effect of depolarisation in case of high flux, for active imagery for which it can reduce the effect of depolarisation and slowing caused by the collective RC effect.

The invention claimed is:

1. A photodetection device comprising a substrate and a network of diodes, the substrate comprising an absorption layer and each diode comprising, in the absorption layer, a collection region having a first type of doping and being in contact with an electrically conducting pad, the photodetection device further comprising a conduction mesh under a surface of the substrate, the conduction mesh comprising at least one conduction channel inserted between the collection regions of two adjacent diodes, the at least one conduction channel having a second type of doping opposite the first type of doping and a higher doping density than the absorption layer, wherein the absorption layer has the first type of doping, the conduction mesh is covered by a metal mesh present on the surface of the substrate, and the doping density of the at least one conduction channel is derived from metal diffusion in the absorption layer from the metal mesh.

2. The photodetection device according to claim 1, further comprising a peripheral substrate contact on at least one side of the diodes network.

3. The photodetection device according to claim 2, wherein the metal mesh is in electrical contact with the peripheral substrate contact.

4. The photodetection device according to claim 1, wherein the conduction mesh has at least one conduction channel extending between two adjacent rows of diodes.

5. The photodetection device according to claim 4, wherein the conduction mesh has a plurality of conduction channels arranged such that there is a conduction channel inserted between the collection regions of all adjacent diodes in the diodes network.

6. The photodetection device according to claim 1, further comprising a passivation layer which covers the substrate except at each electrically conducting pad.

7. The photodetection device according to claim 1, wherein the doping density of the absorption layer is less than $10^{15}$ at/cm$^3$.

8. The photodetection device according to claim 1, wherein the absorption layer includes a gradual or sudden gap reduction within the thickness of the absorption layer from the surface of the substrate, said gradual or sudden gap reduction delimiting a large gap region near the surface in which the conduction mesh and collection regions are located.

9. A photodetection device comprising a substrate and a network of diodes, the substrate comprising an absorption layer and each diode comprising, in the absorption layer, a collection region having a first type of doping and being in contact with an electrically conducting pad, the photodetection device further comprising a conduction mesh under a surface of the substrate, the conduction mesh comprising at least one conduction channel inserted between the collection regions of two adjacent diodes, the at least one conduction channel having a second type of doping opposite the first type of doping and a higher doping density than the absorption layer, wherein the absorption layer has the first type of doping, and the absorption layer is a CdHgTe layer.

10. The photodetection device according to claim 9, wherein the conduction mesh is covered by a metal mesh present on the surface of the substrate.

11. The photodetection device according to claim 10, wherein the doping density of the at least one conduction channel is derived from metal diffusion in the absorption layer from the metal mesh.

12. The photodetection device according to claim 9, further comprising a peripheral substrate contact on at least one side of the diodes network.

13. The photodetection device according to claim 12, wherein the conduction mesh is covered by a metal mesh present on the surface of the substrate, and the metal mesh is in electrical contact with the peripheral substrate contact.

14. The photodetection device according to claim 9, wherein the conduction mesh has at least one conduction channel extending between two adjacent rows of diodes.

15. The photodetection device according to claim 14, wherein the conduction mesh has a plurality of conduction channels arranged such that there is a conduction channel inserted between the collection regions of all adjacent diodes in the diodes network.

16. The photodetection device according to claim 9, further comprising a passivation layer which covers the substrate except at each electrically conducting pad.

17. The photodetection device according to claim 9, wherein the doping density of the absorption layer is less than $10^{15}$ at/cm$^3$.

18. The photodetection device according to claim 9, wherein the absorption layer includes a gradual or sudden gap reduction within the thickness of the absorption layer from the surface of the substrate, said gradual or sudden gap reduction delimiting a large gap region near the surface in which the conduction mesh and collection regions are located.

* * * * *